(12) United States Patent
Yao

(10) Patent No.: US 7,704,890 B2
(45) Date of Patent: Apr. 27, 2010

(54) METHOD FOR FABRICATING THIN FILM TRANSISTOR AND PIXEL STRUCTURE

(75) Inventor: Chi-Wen Yao, Taoyuan (TW)

(73) Assignee: AU Optronics Corp., Hsinchu (TW)

( * ) Notice: Subject to any disclaimer, the term of this patent is extended or adjusted under 35 U.S.C. 154(b) by 988 days.

(21) Appl. No.: 11/452,789

(22) Filed: Jun. 13, 2006

(65) Prior Publication Data

US 2007/0026347 A1 Feb. 1, 2007

(30) Foreign Application Priority Data

Jul. 27, 2005 (TW) .............................. 94125382 A

(51) Int. Cl.
*H01L 21/302* (2006.01)
(52) U.S. Cl. .................. 438/720; 438/514; 438/709; 438/710
(58) Field of Classification Search .................. 438/706, 438/710, 712, 717, 720, 709, 514, 518, 519
See application file for complete search history.

(56) References Cited

U.S. PATENT DOCUMENTS

| | | | |
|---|---|---|---|
| 6,939,750 B2* | 9/2005 | Hotta et al. .................. | 438/149 |
| 2003/0207180 A1* | 11/2003 | Shu .............................. | 430/5 |
| 2005/0045883 A1* | 3/2005 | Takahashi ..................... | 257/59 |

* cited by examiner

*Primary Examiner*—Lan Vinh
(74) *Attorney, Agent, or Firm*—J.C. Patents

(57) ABSTRACT

A method for fabricating a TFT is provided. First, a poly-silicon layer is formed over a substrate. A photoresist layer is formed on the poly-silicon layer, wherein the photoresist layer has a pattern for exposing parts of the poly-silicon layer, and the pattern has a varied thickness. The poly-silicon layer is patterned by using the photoresist layer as an etching mask to define a poly-silicon island. Thereafter, a part of the thickness of the photoresist layer is removed for exposing a part of the poly-silicon island. Then, a first ion implanting is performed on the exposed part of the poly-silicon island to form a source and a drain thereby. After removing the residue photoresist layer; a gate insulating layer, a gate, a patterned dielectric layer and a conductive layer are formed on the substrate sequentially.

13 Claims, 9 Drawing Sheets

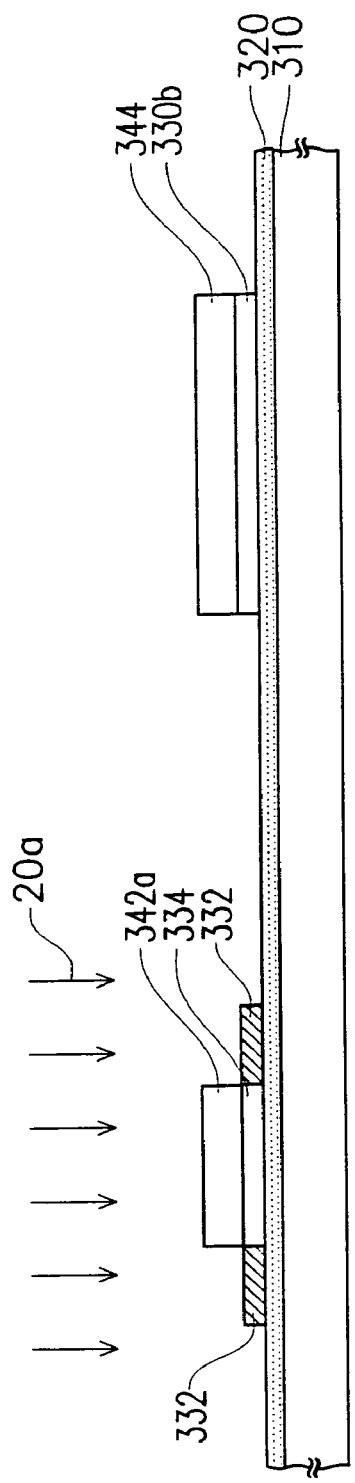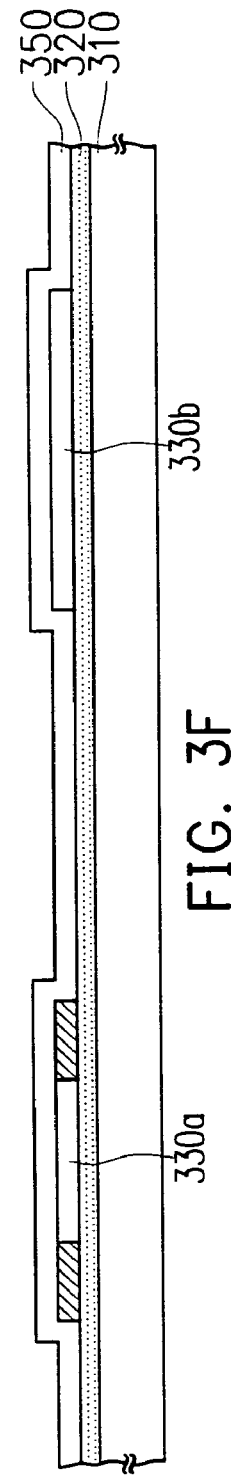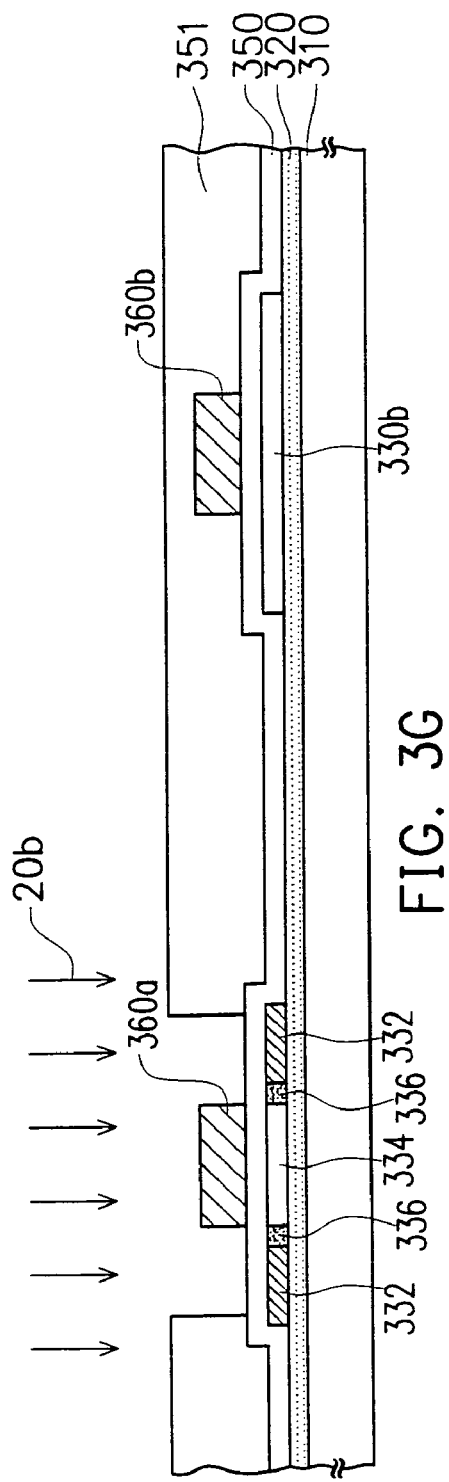

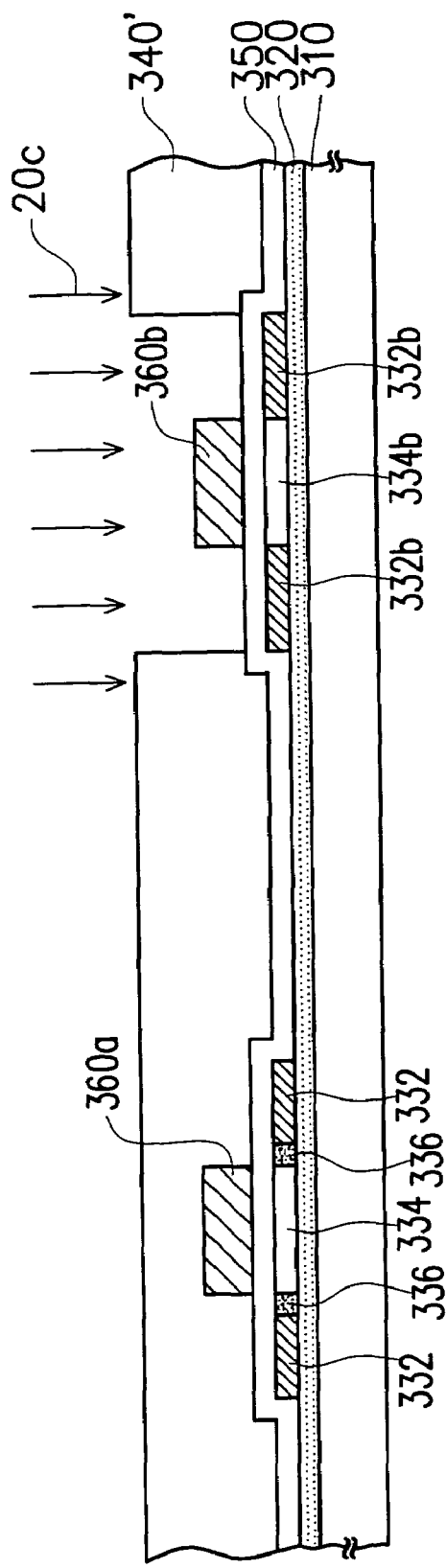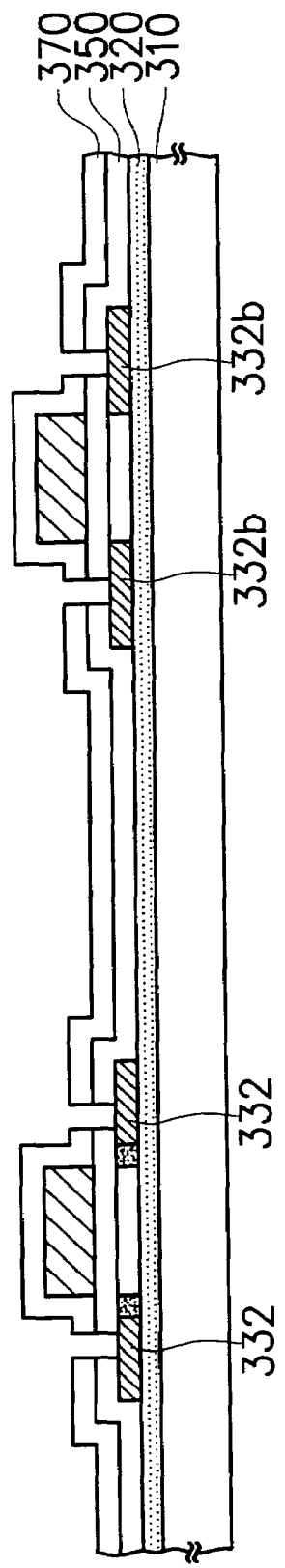

METHOD FOR FABRICATING THIN FILM TRANSISTOR AND PIXEL STRUCTURE

CROSS-REFERENCE TO RELATED APPLICATION

This application claims the priority benefit of Taiwan application serial no. 94125382, filed on Jul. 27, 2005. All disclosure of the Taiwan application is incorporated herein by reference.

BACKGROUND OF THE INVENTION

1. Field of Invention

The present invention relates to a method for fabricating thin film transistors (TFTs) and pixel structures, and particularly to a method for fabricating low temperature polysilicon (LTPS) TFTs and LTPS pixel structures.

2. Description of Related Art

Nowadays, benefiting from fast development of optoelectronic technology and semiconductor technology, the video and image devices are now becoming lighter and slimmer. Notwithstanding a few advantages they still has, cathode ray tube (CRT) displays are limited by their large bulk and radiations that to some degree hurt human eyes. Flat panel displays, including liquid crystal displays (LCDs), have advantages such as thinner configuration, lighter weight, lower operation voltage, less power consumption, all colorization and lower radiation, thus becoming a mainstream of the display market in the 21 century.

LCDs are generally categorized into an active matrix type and a passive matrix type, according to driving methods thereof. An active matrix type LCD usually uses thin film transistors (TFTs) as driving switches. TFTs are generally categorized into amorphous silicon TFTs and poly-silicon TFTs, according to materials adopted for making channel layers thereof.

Previous poly-silicon TFTs were generally fabricated under a relative high temperature up to 1000° C., due to which only limited quantity of materials can be selected for making substrates. However, the development of laser technology makes it possible to fabricate poly-silicon TFTs under a lower temperature up to 600° C., which is called low temperature poly-silicon TFTs (LTPS-TFTs).

LTPS-TFTs have many advantages that amorphous silicon TFTs do not have, such as high aperture ratio, high resolution, and excellent display quality, as well as capability of integrating a driving integrated circuit onto a glass substrate. Unfortunately, a process for fabricating LTPS-TFTs is much more complicated and need more steps of mask processing than a process for fabricating amorphous silicon TFTs which usually requires five steps of mask processing. Fabricating typical complementary LTPS-TFTs require eight steps or nine steps of mask processing, which cost much. Therefore, what is needed is to simplify current mask processing for the LTPS-TFTs.

SUMMARY OF THE INVENTION

An object of the present invention is to provide a method for fabricating a TFT, which requires less steps of mask processing.

Another object of the present invention is to provide a method for fabricating a pixel structure, which requires less steps of mask processing.

The present invention provides a method for fabricating a TFT. First, a poly-silicon layer is formed over a substrate. A photoresist layer is formed on the poly-silicon layer, wherein the photoresist layer has a pattern for exposing parts of the poly-silicon layer, and the pattern has a varied thickness. Thereafter, the poly-silicon layer is patterned by using the photoresist layer as an etching mask to define a poly-silicon island. Then, a part of the thickness of the photoresist layer is removed for exposing a part of the poly-silicon island. A first ion implanting is performed on the exposed part of the poly-silicon island to form a source and a drain thereby, wherein a channel is defined between the source and drain. After removing the residue photoresist layer, a gate insulating layer is formed over the substrate for covering the poly-silicon island. Then, a gate is formed on the gate insulating layer. A patterned dielectric layer is formed on the gate, wherein the patterned dielectric layer exposes parts of the source and drain. Next, a conductive layer is formed on the patterned dielectric layer, and the conductive layer is electrically connected with the source and drain.

According to an aspect of the embodiment, between the step of forming the gate and the step of forming the patterned dielectric layer, the method further includes a step of performing a lightly ion implanting by using the gate as a mask for forming a lightly doped drain between the source and drain and the channel.

According to another aspect of the embodiment, between the step of forming the poly-silicon layer and forming the photoresist layer, the method further includes a step of performing a second ion implanting for implanting ions into the poly-silicon layer.

According to a still another aspect of the embodiment, before forming the poly-silicon layer over the substrate, the method further includes a step of forming a buffer layer on the substrate.

According to a further aspect of the embodiment, the step for forming the photoresist layer includes conducting a photolithographic process with a mask having a nontransparent zone, a partly transparent zone and a completely transparent zone.

The present invention further provides a method for fabricating a TFT. First, a poly-silicon layer is formed over a substrate. A photoresist layer is formed on the poly-silicon layer, wherein the photoresist layer includes a first portion and a second portion for exposing parts of the poly-silicon layer, and the first portion includes a pattern having a varied thickness. Thereafter, the poly-silicon layer is patterned by using the photoresist layer as an etching mask to defining a first poly-silicon island and a second poly-silicon island. A part of the thickness of the photoresist layer is removed for exposing a part of the first poly-silicon island. A first ion implanting is performed on the exposed part of the first poly-silicon island to form a first source and a first drain thereby, wherein a first channel is defined between the first source and drain. After removing the residue photoresist layer, a gate insulating layer is formed over the substrate for covering the first poly-silicon island and the second poly-silicon island. Then, a first gate is formed on the gate insulating layer over the first poly-silicon island and a second gate is formed on the gate insulating layer over the second poly-silicon island. Next, a lightly ion implanting is performed by using the first gate as a mask for forming a lightly doped drain between the first source and drain and the first channel. A second ion implanting is performed for forming a second source and a second drain in the second poly-silicon island under both sides of the second gate, wherein a second channel is defined between the second source and drain. Thereafter, a patterned dielectric layer is formed over the substrate, wherein the patterned dielectric layer exposes parts of the first source and drain and parts of the second source and drain. A conductive layer is formed on the patterned dielectric layer, wherein the conductive layer is electrically connected with the first source and drain and the second source and drain.

According to an aspect of the embodiment, between the step of forming the poly-silicon layer and forming the photoresist layer, the method further includes a step of conducting a third ion implanting process for implanting ions into the first poly-silicon layer.

According to another aspect of the embodiment, before forming the poly-silicon layer over the substrate, the method further includes a step of forming a buffer layer on the substrate.

According to a further aspect of the embodiment, the step of forming the photoresist layer includes performing a photolithographic process with a mask having a nontransparent zone, a partly transparent zone and a completely transparent zone.

The present invention further provides a method for fabricating a pixel structure. First, a poly-silicon layer is formed over a substrate. A photoresist layer is formed on the poly-silicon layer, wherein the photoresist layer includes a first portion and a second portion for exposing parts of the poly-silicon layer, and the first portion includes a pattern having a varied thickness. Thereafter, the poly-silicon layer is patterned by using the photoresist layer as an etching mask to define a first poly-silicon island and a second poly-silicon island. A part of the thickness of the photoresist layer is removed for exposing a part of the first poly-silicon island. Then, a first ion implanting is performed on the exposed part of the first poly-silicon island to form a first source and a first drain, wherein a first channel is defined between the first source and drain. After removing the residue photoresist layer, a gate insulating layer is formed over the substrate for covering the first poly-silicon island and the second poly-silicon island. A first gate is formed on the gate insulating layer over the first poly-silicon island and a second gate is formed on the gate insulating layer over the second poly-silicon island. A lightly ion implanting is performed by using the first gate as a mask for forming a lightly doped drain between the first source and drain and the first channel. A second ion implanting is performed for forming a second source/and a second drain in the second poly-silicon island under both sides of the second gate, wherein a second channel is defined between the second source and drain. A patterned dielectric layer is formed over the substrate, wherein the patterned dielectric layer exposes parts of the first source and drain and parts of the second source and drain. A conductive layer is formed on the patterned dielectric layer, wherein the conductive layer is electrically connected with the first source and drain and the second source and drain. Then, a protecting layer is formed over the substrate, wherein a part of the conductive layer is exposed. A transparent conductive layer is formed on the protecting layer and is electrically connected with the exposed conductive layer.

According to an aspect of the embodiment, between the step of forming the poly-silicon layer and forming the photoresist layer, the method further includes a step of conducting a third ion implanting process for implanting ions into the first poly-silicon layer.

According to another aspect of the embodiment, before forming the poly-silicon layer over the substrate, the method further includes a step of forming a buffer layer on the substrate.

According to a further aspect of the embodiment, the step of forming the photoresist layer includes performing a photolithographic process with a mask having a nontransparent zone, a partly transparent zone and a completely transparent zone.

In the method for fabricating TFTs and pixel structures according to the present invention, a single mask processing is employed for defining poly-silicon islands and implanting ions for forming sources and drains thereby. Compare to conventional technologies, which usually need two masks processing respectively for defining poly-silicon islands and implanting ions for forming sources and drains, the present invention saves masks required for fabricating TFTs and pixels structures and simplifies fabricating process and thus saving the production cost thereof.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A through 3J are schematic isometric cross-sectional views of a TFT fabricating flow according to a second embodiment of the present invention.

DESCRIPTION OF THE PREFERRED EMBODIMENTS

The First Embodiment

Figure 1A:
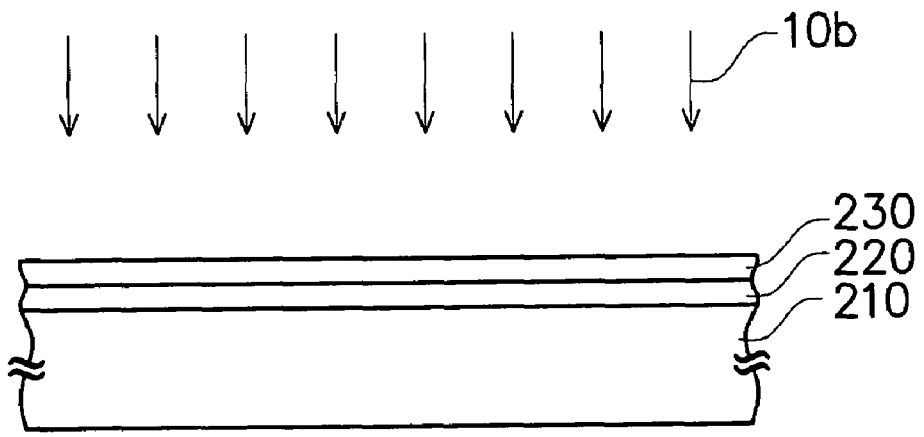
FIGS. 1A through 1I are schematic isometric cross-sectional views of a TFT fabricating flow according to a first embodiment of the present invention.

FIGS. 1A through 1I are schematic isometric cross-sectional views of a TFT fabricating flow according to a first embodiment of the present invention. Referring to FIG. 1A, according to the first embodiment of the present invention, a method for fabricating a TFT 200 includes the steps as below. First, a poly-silicon layer 230 is formed over a substrate 210. The substrate 210 for example is made of glass or plastic materials.

Herein, a process for forming the poly-silicon layer 230 for example includes steps of: first, forming a amorphous silicon layer (not shown) over the substrate 210, wherein the method for forming the amorphous silicon layer can be for example chemical vapor deposition (CVD) method; then laser annealing the formed amorphous silicon layer so that the amorphous silicon layer is converted into a poly-silicon layer 230. According to an aspect of the embodiment, a buffer layer 220 is formed over the substrate 210 before the poly-silicon layer 230 is formed. The buffer layer 220 for example can be made of silicon dioxide or silicon nitride. The buffer layer 220 is adapted for preventing metal ions or impurities diffusing from the substrate 210 into the poly-silicon layer 230.

Figure 1B:
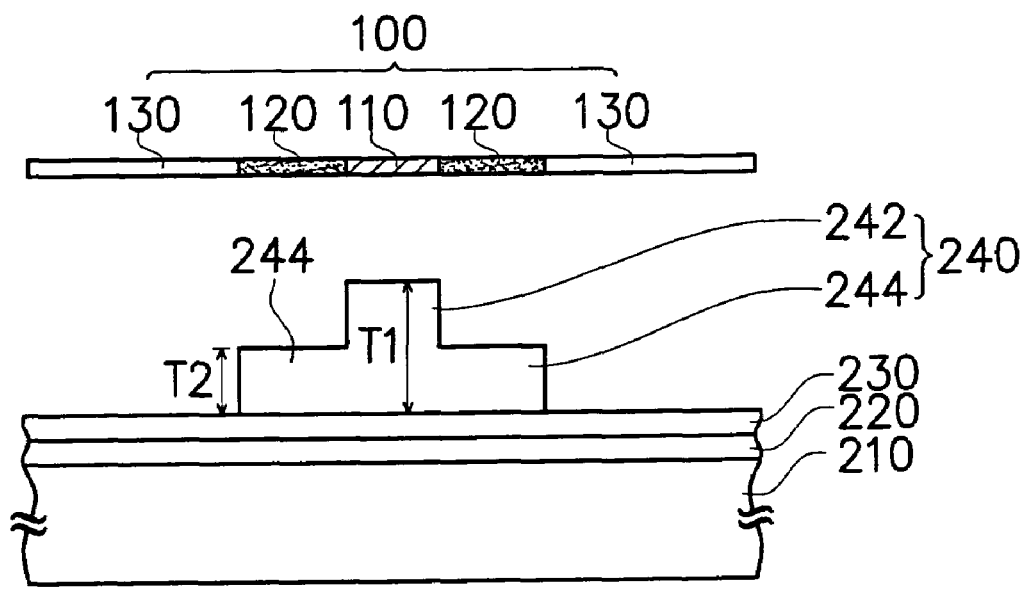

Then, as shown in FIG. 1B, a photoresist layer 240 is formed on the poly-silicon layer 230, wherein the photoresist layer 240 includes a middle portion 242 and a side portion 244, and the middle portion 242 has a thickness T1 greater than a thickness T2 of the side portion 244. According to an aspect of the embodiment, a half-tone technology is employed for forming the photoresist layer 240, the process of which including steps of: first forming a photoresist material layer (not shown) on the poly-silicon layer 230; then performing a photolithography process with a mask 100 to form the photoresist layer 240 including a middle portion 242 and a side portion 244. The mask 100 includes a nontransparent zone 110, a partly transparent zone 120 and a completely transparent zone 130, which define different exposure degrees when exposing. Thus the design of the mask 100 determines the distribution of middle portion 242 and the side portion 244 of the photoresist layer 240.

According to another aspect of the embodiment, between the step of forming the poly-silicon layer 230 and the step of forming the photoresist layer 240, the method further includes a step of conducting an ion implanting process 10b, which is also known as a channel doping process, for adjusting an electrical property of the poly-silicon layer 230.

Figure 1C:
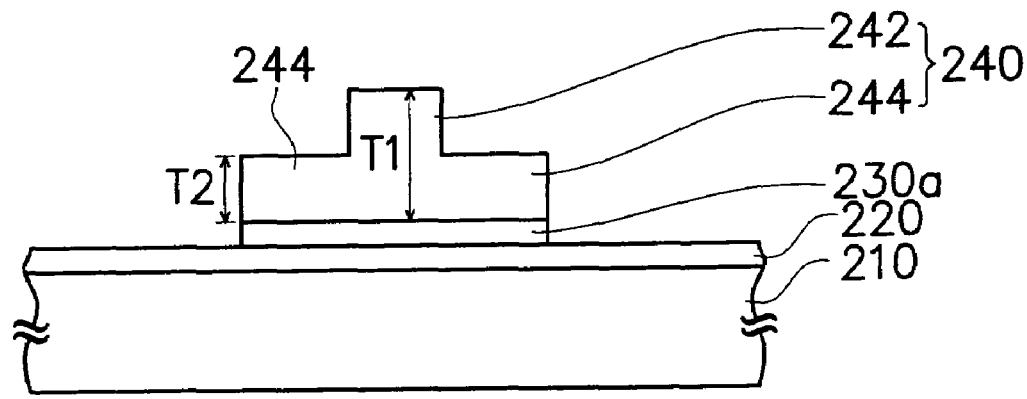

Then referring to FIG. 1C, with the photoresist layer 240 as an etching mask, an etching process to the poly-silicon layer 230 is conducted for patterning the poly-silicon layer 230 so as to define a poly-silicon island 230a.

Figure 1D:
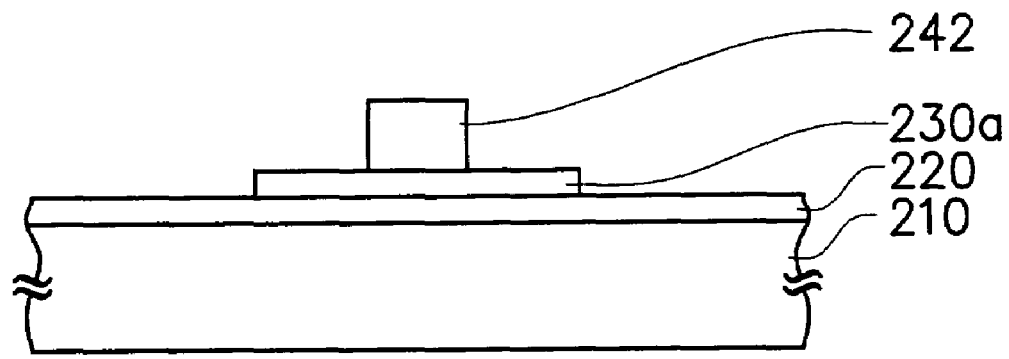
Figure 1E:
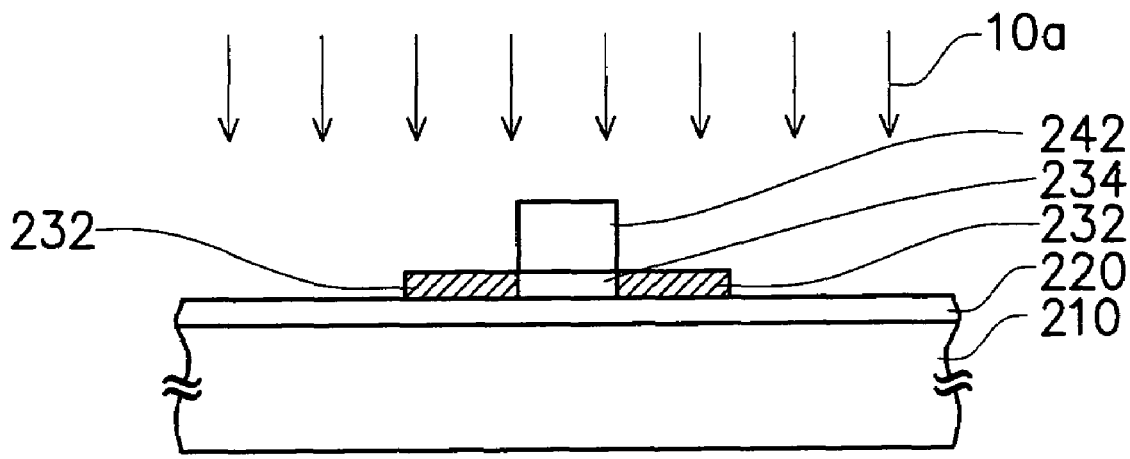

Then referring to FIG. 1D, a part of thickness of the photoresist layer 240 is removed so that the middle portion 242 of the photoresist layer 240 is left and the side portion 244 is removed for exposing part of the poly-silicon island 230a. Then referring to FIG. 1E, an ion implanting process 10a is conducted for forming a source and a drain 232 in the exposed poly-silicon island 230a, wherein a channel 234 is defined therebetween. The ion implanting process 10a for example is implanting n-type dopant such as phosphor ions or p-type dopant such as boron ions.

Figure 1F:
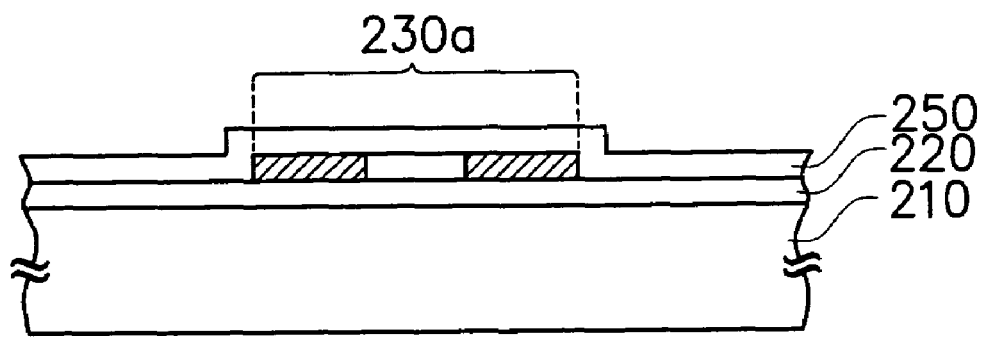

Referring to FIG. 1F, the residue photoresist layer, herein the middle portion 242, is then removed. Thereafter, a gate insulating layer 250 is formed over the substrate 210 to cover the poly-silicon island 230a. Referring to FIG. G, a gate 260 is formed on the gate insulating layer 250. The method for forming the gate 260 for example is depositing a gate material layer (not shown) on the gate insulating layer 250 with a sputtering or other deposition process, then a photolithographic and etching process is performed for the gate material layer to form such a gate 260.

Figure 1G:
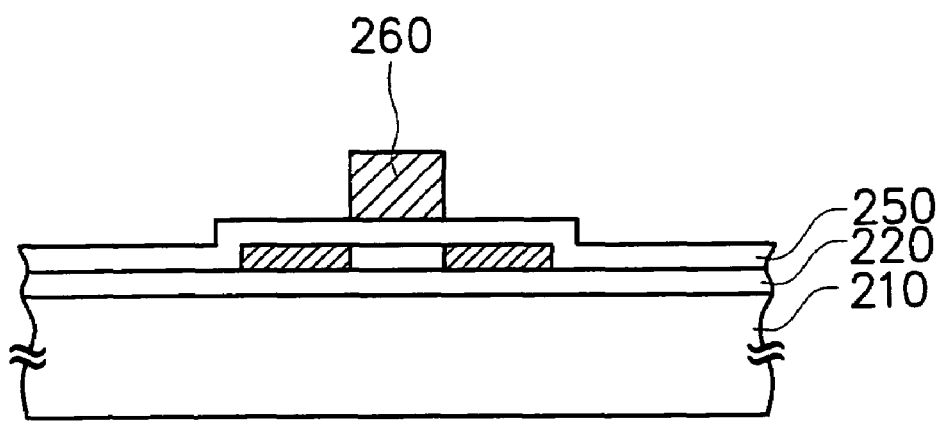
Figure 1H:
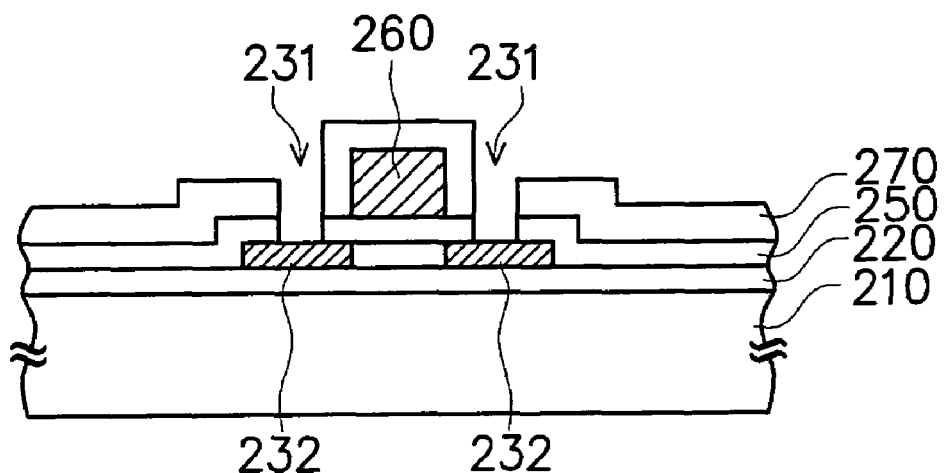

Referring to FIG. 1H, a patterned dielectric layer 270 is then formed over the substrate 210. The patterned dielectric layer 270 for example can be made of dielectric materials such as silicon dioxide and silicon nitride. The patterned dielectric layer 270 covers the gate 260 and has openings 231 therein for exposing a part of the source/drain 232. A method for forming the patterned dielectric layer 270 for example includes: forming a dielectric layer (now shown) over the substrate 210, wherein the dielectric layer can be made of dielectric materials such as silicon dioxide and silicon nitride; then a photolithographic and etching process is performed for the dielectric layer to form the patterned dielectric layer 270.

Figure 1I:
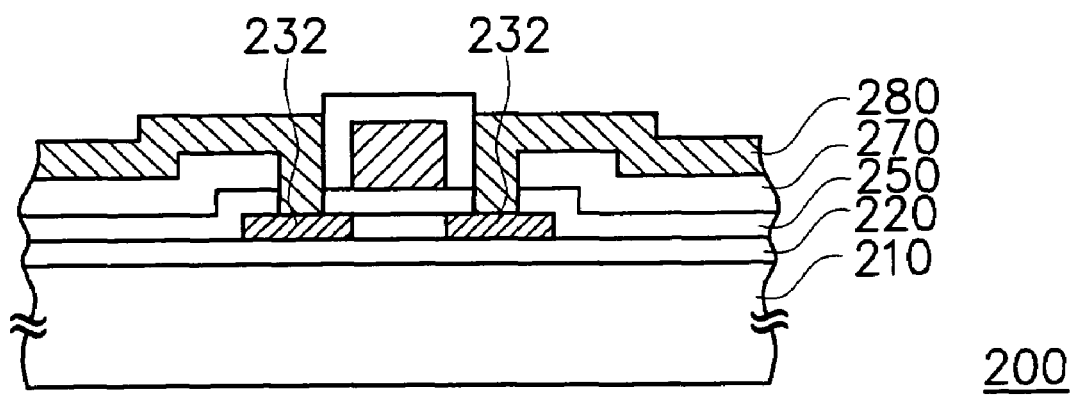

Referring to FIG. 1I, then a conductive layer 280 is formed over the substrate 210, and the conductive layer 280 is electrically connected with the source and drain 232. Thus, a fabricating process of a TFT 200 is completed. The process for forming the conductive layer 280 for example includes: depositing a conductor material layer (not shown) on the patterned dielectric layer 270 with a sputtering or other deposition process, then a photolithographic and etching process is performed for the conductor material layer to form such a conductive layer 280.

Figure 2:
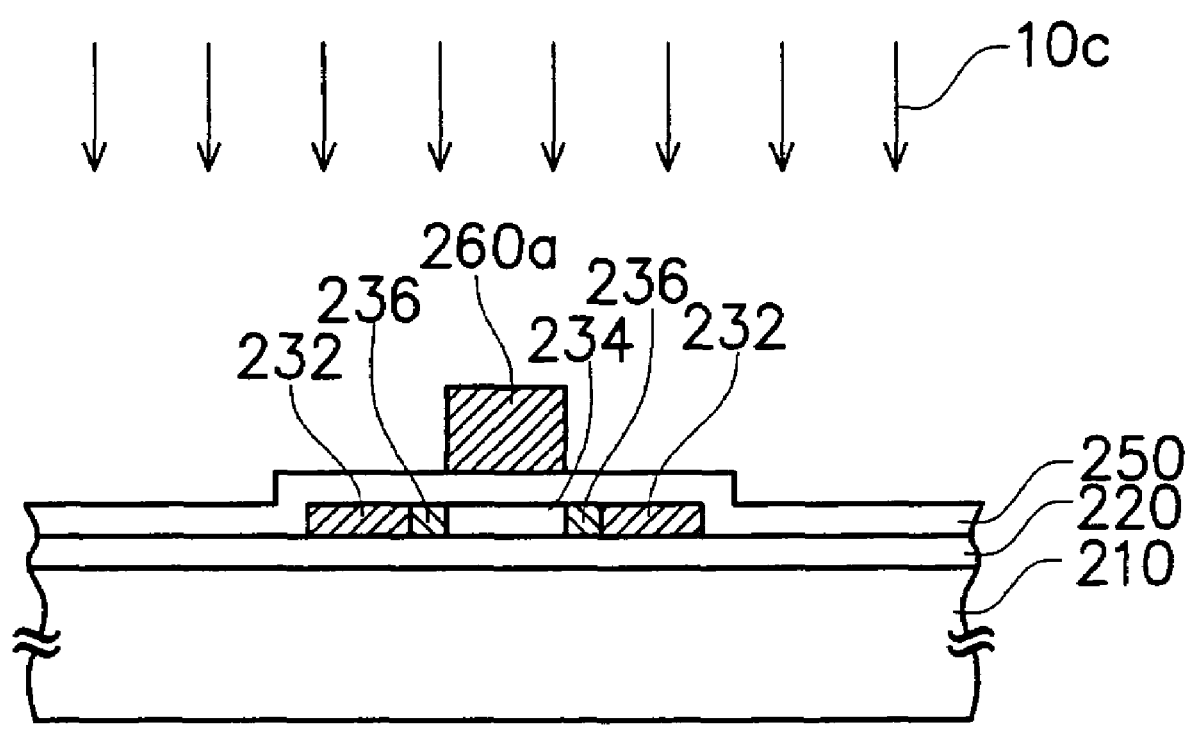
FIG. 2 is a schematic isometric cross-sectional view of another TFT according to the first embodiment of the present invention for illustrating another method for fabricating a TFT.

FIG. 2 is a schematic isometric cross-sectional view of another TFT according to an embodiment of the present invention for illustrating another method for fabricating a TFT. Referring to FIG. 2, the method is similar with the foregoing methods for fabricating TFTs (as illustrated in FIGS. 1A through 1I), while the difference therebetween is: when defining the gate 260 as shown in FIG. 1G, a herein defined gate 260a has sidewalls not aligned with a profile of the source/drain 232, therefore a lightly ion implanting process is conducted by using the gate 260a as a mask to form a lightly doped drain 236 between the source and drain 232 and the channel 234 for improving a hot carrier effect thereby.

According to the embodiment of the present invention, the photoresist layer 240 formed on the poly-silicon layer 230 has a middle portion 242 having a thickness T1 and a side portion 244 having a thickness T2, wherein T1 differs from T2. Therefore, the photoresist layer 240 can function as an etching mask for defining at least one poly-silicon island 230a. Thereafter, a part of thickness of the photoresist layer 240 is removed, during which the side portion 244 is removed and the middle portion 242 is left thereby. Consequently, the left middle portion 242 can function as a mask for conducting an ion implanting process 10a for forming a source and drain 232 in the exposed poly-silicon island 230a. In summary, a single mask processing is employed for defining the poly-silicon island 230a and implanting ions for forming the source and drain 232 thereby, thus saving masks required for fabricating TFTs and simplifying fabricating process and saving the production cost thereof.

The Second Embodiment

Figure 3A:
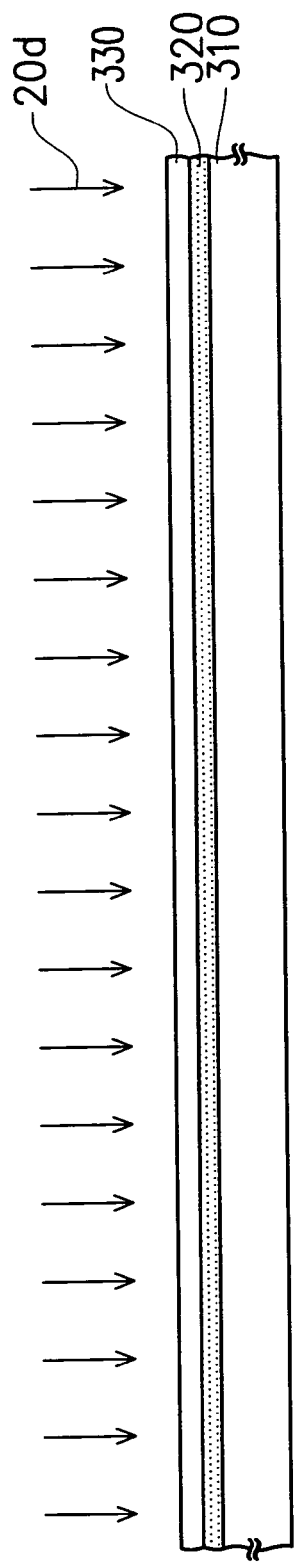
Figure 3B:
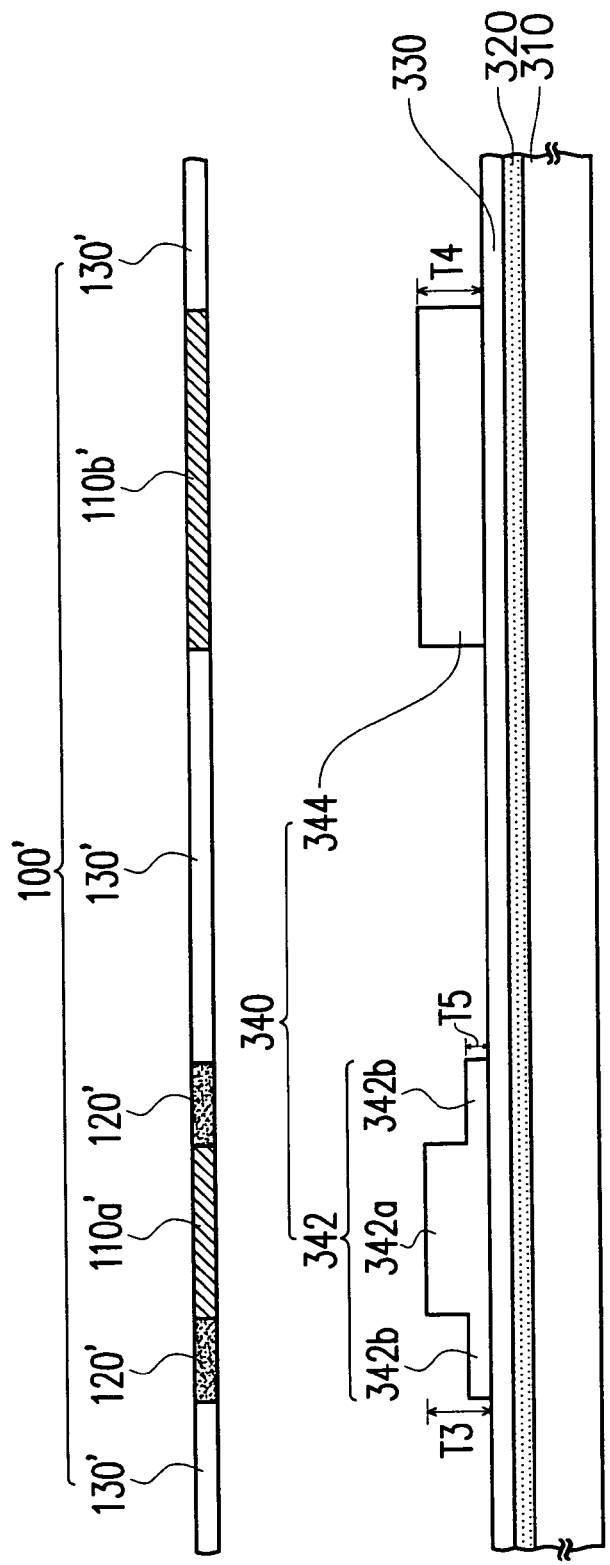

FIGS. 3A through 3J are schematic isometric cross-sectional views of a TFT fabricating flow according to a second embodiment of the present invention. Referring to FIG. 3A, a poly-silicon layer 330 is formed over a substrate 310. According to an aspect of the embodiment, a buffer layer 320 is preferably formed on the substrate 310 prior to the poly-silicon layer 330 for preventing the metal ions or impurities of the substrate 310 diffusing into the poly-silicon layer 330. Then, referring to FIG. 3B, a photoresist layer 340 is formed on the poly-silicon layer 330, wherein the photoresist layer 340 includes a first portion 342 and a second portion 344, and the first portion 342 includes a middle portion 342a and a side portion 342b. In particular, a thickness T3 of the middle portion 342a and a thickness T4 of the second portion 344 are greater than a thickness T5 of the side portion 342b. According to an aspect of the embodiment, the photoresist layer 340 is formed with the half-tone technology illustrated in the first embodiment, wherein a mask 100' includes two nontransparent zones 110a' and 110b', a partly transparent zone 120' and a completely transparent zone 130' is employed for conducting a photolithographic process.

According to an aspect of the embodiment, between the step of forming the poly-silicon layer 330 and the step of forming the photoresist layer 340, the method further includes a step of conducting an ion implanting process 20d (as shown in FIG. 3A) which is also known as a channel doping process.

Figure 3C:
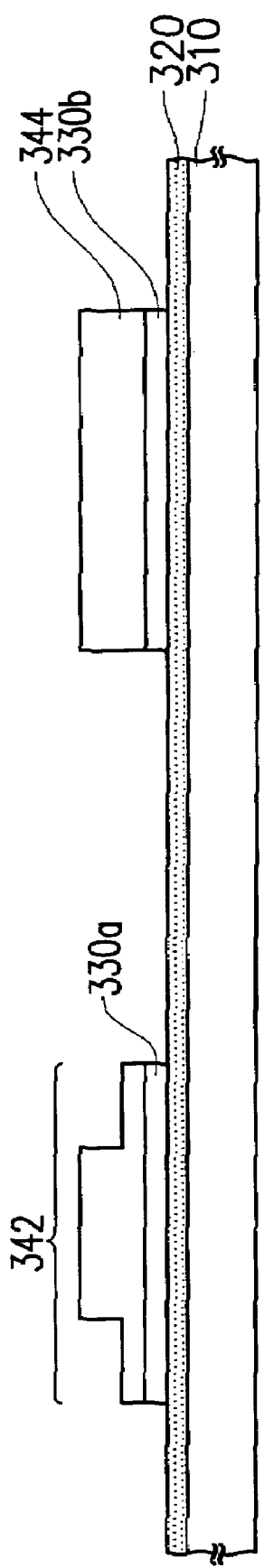

Referring to FIG. 3C, the poly-silicon layer 330 is then patterned with the photoresist layer 340 as an etching mask for defining poly-silicon islands 330a and 330b.

Figure 3D:
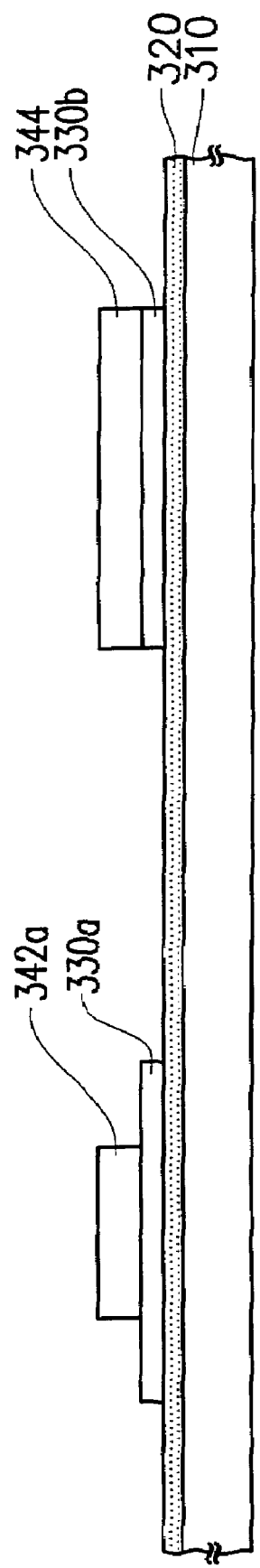
Figure 3J:
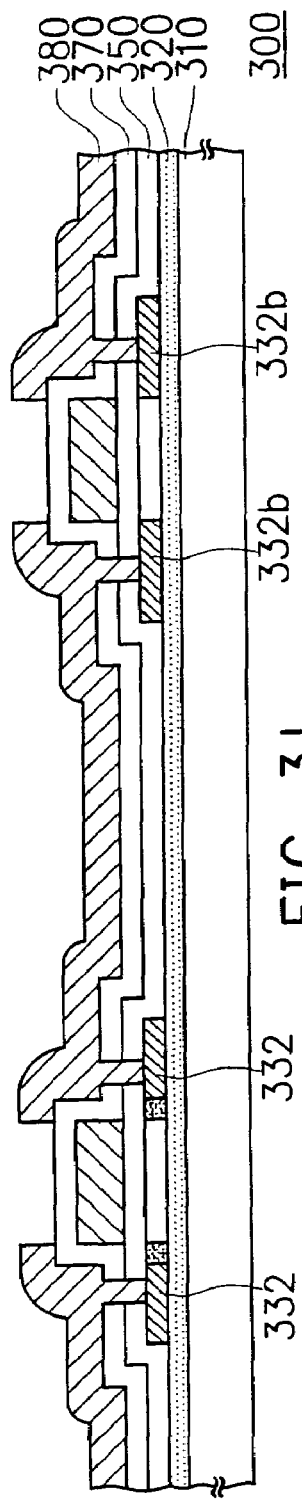

Referring to FIG. 3D, parts of the thickness of the photoresist layer 340 are removed, wherein the middle portion 342a and the second portion 344 are left and the side portion 342b are removed so that a part of the poly-silicon island 330a is exposed.

Referring to FIG. 3E, an ion implanting process 20a is then conducted to form a source and drain 332 in the exposed part of the poly-silicon island 330a, wherein a channel 334 is defined between the source and drain 332. The ion implanting process 20a for example is implanting n-type dopant, and the n-type dopant for example is phosphor ions.

Referring to FIG. 3F, the second portion 344 and the middle portion 342a of the photoresist layer 340 are removed. Then a gate insulating layer 350 is formed over the substrate 310 for covering the poly-silicon islands 330a and 330b. Referring to FIG. 3G, gates 360a and 360b are respectively formed on the gate insulating layer 350 over the poly-silicon islands 330a and 330b. Then, a patterned photoresist layer 351 is formed and a lightly ion implanting process 20b is conducted by using the gate 360a and the patterned photoresist layer 351 as a mask for forming a lightly doped drain 336 between the source and drain 332 and the channel 334. The ion implanting process 20b for example is implanting n-type dopant, and the n-type dopant for example is phosphor ions.

Then referring to FIG. 3H, after removing the patterned photoresist layer 351, another patterned photoresist layer 340' is then formed on the substrate 310 for exposing the gate 360b and a part of the gate insulating layer 350 located over the poly-silicon island 330b. Then an ion implanting process 20c is conducted for forming a source and drain 332b in the poly-silicon island 330b located under both sides of the gate 360b. A channel 334b is defined between the source and drain 332b. The ion implanting process 20c for example is implanting p-type dopant, and the p-type dopant for example is boron ions. Thereafter, the patterned photoresist layer 340' is removed.

Then referring to FIG. 3I, a patterned dielectric layer 370 is formed over the substrate 310, wherefrom a part of the sources and drains 332, 332b are exposed. Then referring to FIG. 3J, a conductive layer 380 is formed on the patterned dielectric layer 370, and the conductive layer 380 is electrically connected with the sources and drains 332 and 332b. Then a TFT 300 is fabricated accordingly.

According to the embodiment of the invention, the photoresist layer 340 formed on the poly-silicon layer 330 can not only function as an etching mask for defining the poly-silicon islands 330a and 330b, but also function as an implanting mask of the source and drain 332 after parts of the thickness of the photoresist layer being removed. Therefore, the method for fabricating a TFT 300 requires less masks, thus saving production cost for fabricating a TFT 300.

Figure 3K:
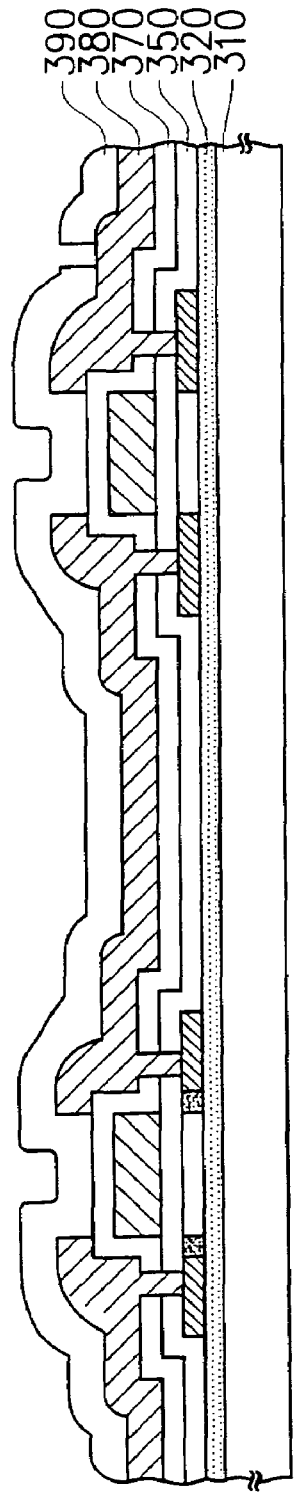
FIGS. 3K and 3L are schematic isometric cross-sectional views of a pixel structure fabricating flow with a TFT of FIGS. 3A through 3J.

The present invention further provides a method for fabricating a pixel structure. After a TFT 300 is obtained through the steps as shown in FIG. 3A through 3J, referring to FIG. 3k, a patterned protecting layer 390 is formed over the substrate 310, wherefrom a part of the conductive layer 380 is exposed from. The method for forming such a patterned protecting layer 390 for example includes: forming a protecting layer (not shown) over the substrate 310, then a photolithographic and etching process is performed for the protecting layer to form the patterned protecting layer 390.

Figure 3L:
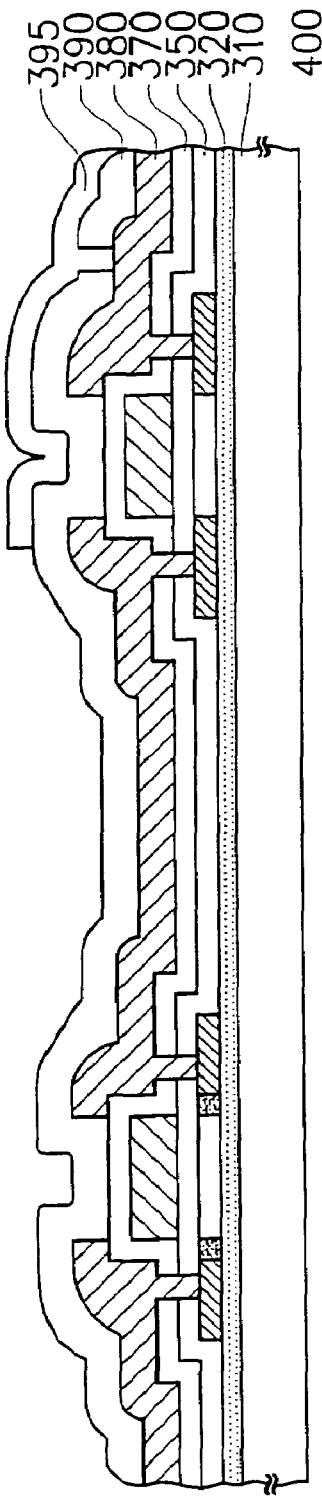

Thereafter, referring to FIG. 3L, a transparent conductive layer 395 is formed over the substrate 310, and the transparent conductive layer 395 is electrically connected with the exposed conductive layer 380. And therefore, a pixel structure 400 is fabricated accordingly.

In summary, comparing with conventional methods for fabricating TFTs and pixel structures, the present invention needs a single mask for defining the poly-silicon islands and implanting ions for forming sources and drains. The method for fabricating TFTs and pixel structures saves masks required for fabricating TFTs and pixels structures and simplifies fabricating process and thus saving the production cost thereof.

Other modifications and adaptations of the above-described preferred embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

What is claimed is:

1. A method for fabricating a thin film transistor (TFT), comprising:
   forming a poly-silicon layer over a substrate;
   forming a photoresist layer on the poly-silicon layer, wherein the photoresist layer has a pattern for exposing a part of the poly-silicon layer, and the pattern has a varied thickness;
   patterning the poly-silicon layer by using the photoresist layer as an etching mask to define a poly-silicon island;
   removing a part of the thickness of the photoresist layer for exposing a part of the poly- silicon island, wherein a portion of the photoresist layer is remained;
   performing a first ion implanting on the exposed part of the poly-silicon island by using the remained portion of photoresist layer as an implanting mask to form a source and a drain, wherein a channel is defined between the source and drain;
   removing the residue photoresist layer;
   forming a gate insulating layer over the substrate and the poly-silicon island;
   forming a gate on the gate insulating layer;
   forming a patterned dielectric layer over the gate, wherein the patterned dielectric layer exposes parts of the source and drain; and
   forming a conductive layer on the patterned dielectric layer, wherein the conductive layer is electrically connected with the source and drain.

2. The method for fabricating a TFT according to claim 1, further comprising performing a lightly ion implanting by using the gate as mask to form a lightly doped drain between the source and drain and the channel before forming the gate and after forming the patterned dielectric layer.

3. The method for fabricating a TFT according to claim 1, further comprising performing a second ion implanting for implanting ions into the poly-silicon layer between the step of forming the poly-silicon layer and the step of forming the photoresist layer.

4. The method for fabricating a TFT according to claim 1, further comprising forming a buffer layer before forming the poly-silicon layer over the substrate.

5. The method for fabricating a TFT according to claim 1, wherein the step for forming the photoresist layer comprises conducting a photolithographic process with a mask having a nontransparent zone, a partly transparent zone and a completely transparent zone.

6. A method for fabricating a TFT, comprising:
   forming a poly-silicon layer over a substrate;
   forming a photoresist layer on the poly-silicon layer, wherein the photoresist layer comprises a first portion and a second portion for exposing parts of the poly-silicon layer, and the first portion comprises a pattern having a varied thickness;
   patterning the poly-silicon layer by using the photoresist layer as an etching mask to define a first poly-silicon island and a second poly-silicon island;
   removing a part of the thickness of the photoresist layer for exposing a part of the first poly-silicon island, wherein a portion of the photoresist layer is remained;
   performing a first ion implanting on the exposed part of the first poly-silicon island by using the remained portion of photoresist layer as an implanting mask to form a first source and a first drain, wherein a first channel is defined between the first source and drain;

removing the residue photoresist layer;

forming a gate insulating layer over the substrate for covering the first poly-silicon island and the second poly-silicon island;

forming a first gate on the gate insulating layer over the first poly-silicon island and forming a second gate on the gate insulating layer over the second poly-silicon island;

performing a lightly ion implanting by using the first gate as a mask to form a lightly doped drain between the first source and drain and the first channel;

performing a second ion implanting for forming a second source and a second drain in the second poly-silicon island under both sides of the second gate, wherein a second channel is defined between the second source and drain;

forming a patterned dielectric layer over the substrate, wherein the patterned dielectric layer exposes parts of the first source and drain and parts of the second source and drain; and forming a conductive layer on the patterned dielectric layer, wherein the conductive layer is electrically connected with the first source and drain and the second source and drain.

7. The method for fabricating a TFT according to claim 6, further comprising conducting a third ion implanting process for implanting ions into the poly-silicon layer between the step of forming the poly-silicon layer and the step of forming the photoresist layer.

8. The method for fabricating a TFT according to claim 6, further comprising forming a buffer layer on the substrate before forming the poly-silicon layer over the substrate.

9. The method for fabricating a TFT according to claim 6, wherein the step for forming the photoresist layer comprises conducting a photolithographic process with a mask having a nontransparent zone, a partly transparent zone and a completely transparent zone.

10. A method for fabricating a pixel structure, comprising:
forming a poly-silicon layer over a substrate;
forming a photoresist layer on the poly-silicon layer, wherein the photoresist layer comprises a first portion and a second portion for exposing a part of the poly-silicon layer, and the first portion includes a pattern having a varied thickness;
patterning the poly-silicon layer by using the photoresist layer as an etching mask to define at least a first poly-silicon island and a second poly-silicon island;

removing a part of the thickness of the photoresist layer for exposing a part of the first poly-silicon island;

performing a first ion implanting on the exposed part of the first poly-silicon island to form a first source and a drain, wherein a first channel is defined between the first source and drain;

removing the residue photoresist layer;

forming a gate insulating layer over the substrate for covering the first poly-silicon island and the second poly-silicon island;

forming a first gate on the gate insulating layer over the first poly-silicon island and forming a second gate on the gate insulating layer over the second poly-silicon island;

performing a lightly ion implanting by using the first gate as a mask for forming a lightly doped drain between the first source and drain and the first channel;

performing a second ion implanting for forming a second source and a second drain in the second poly-silicon island under both sides of the second gate, wherein a second channel is defined between the second source and drain;

forming a patterned dielectric layer over the substrate, wherein the patterned dielectric layer exposes parts of the first source and drain and parts of the second source and drain;

forming a conductive layer on the patterned dielectric layer, wherein the conductive layer is electrically connected with the first source and drain and the second source and drain;

forming a protecting layer on the substrate, and a part of the conductive layer is exposed by the protecting layer; and forming a transparent conductive layer on the protecting layer, wherein the transparent conductive layer is electrically connected with the exposed conductive layer.

11. The method for fabricating a pixel structure according to claim 10, further comprising conducting a third ion implanting process for implanting ions into the poly-silicon layer between the step of forming the poly-silicon layer and forming the photoresist layer.

12. The method for fabricating a pixel structure according to claim 10, further comprising forming a buffer layer on the substrate before forming the poly-silicon layer over the substrate.

13. The method for fabricating a pixel structure according to claim 10, wherein the step for forming the photoresist layer comprises conducting a photolithographic process with a mask having a nontransparent zone, a partly transparent zone and a completely transparent zone.

* * * * *